United States Patent [19]
Yoshimori

[11] Patent Number: 5,115,191
[45] Date of Patent: May 19, 1992

[54] TESTING INTEGRATED CIRCUIT CAPABLE OF EASILY PERFORMING PARAMETRIC TEST ON HIGH PIN COUNT SEMICONDUCTOR DEVICE

[75] Inventor: Takashi Yoshimori, Yokohama, Japan

[73] Assignee: Kabushiki Kaisha Toshiba, Kawasaki, Japan

[21] Appl. No.: 713,291

[22] Filed: Jun. 11, 1991

[30] Foreign Application Priority Data

Jun. 12, 1990 [JP] Japan .................. 2-153587

[51] Int. Cl.$^5$ .......................... G01R 31/28
[52] U.S. Cl. .................. 324/158 R; 371/22.1; 371/22.3
[58] Field of Search ........... 324/158 R, 73.1, 158 T; 371/22.1, 22.3, 25.1, 27

[56] References Cited

U.S. PATENT DOCUMENTS

| | | |
|---|---|---|
| 3,790,885 | 2/1974 | James . |
| 4,348,759 | 9/1982 | Schnurmann .............. 371/22.1 |
| 4,566,104 | 1/1986 | Bradshaw et al. ............ 371/22.3 |
| 4,749,947 | 6/1988 | Gheewala . |
| 4,989,209 | 1/1991 | Littlebury et al. ............. 371/22.1 |

Primary Examiner—Ernest F. Karlsen
Attorney, Agent, or Firm—Finnegan, Henderson, Farabow, Garrett, and Dunner

[57] ABSTRACT

A boundary-scan-testing integrated circuit adapted to both a functional test of an entire IC chip and a parametric test for input and output buffers, connected to pads of the IC chip, in a periphery cell area of the IC chip. First memory circuits are respectively formed in an input buffer portion, an output buffer portion, and a bidirectional buffer portion, which are provided in the peripheral cell area of the IC chip. Second memory devices control ON/OFF operations of active elements, formed in the input buffer portion and the bidirectional buffer portion, for supplying a pad potential. Third memory devices control ON/OFF operations of tristate buffers of the output buffer portion and the bidirectional buffer portion. The first, second, and third memory devices are serially connected, thereby constituting a shift register controlled by a first control signal. First and second data selectors are operated by data output from the shift register, thereby controlling input and output buffers, and resistors for determining a potential of pads.

20 Claims, 3 Drawing Sheets

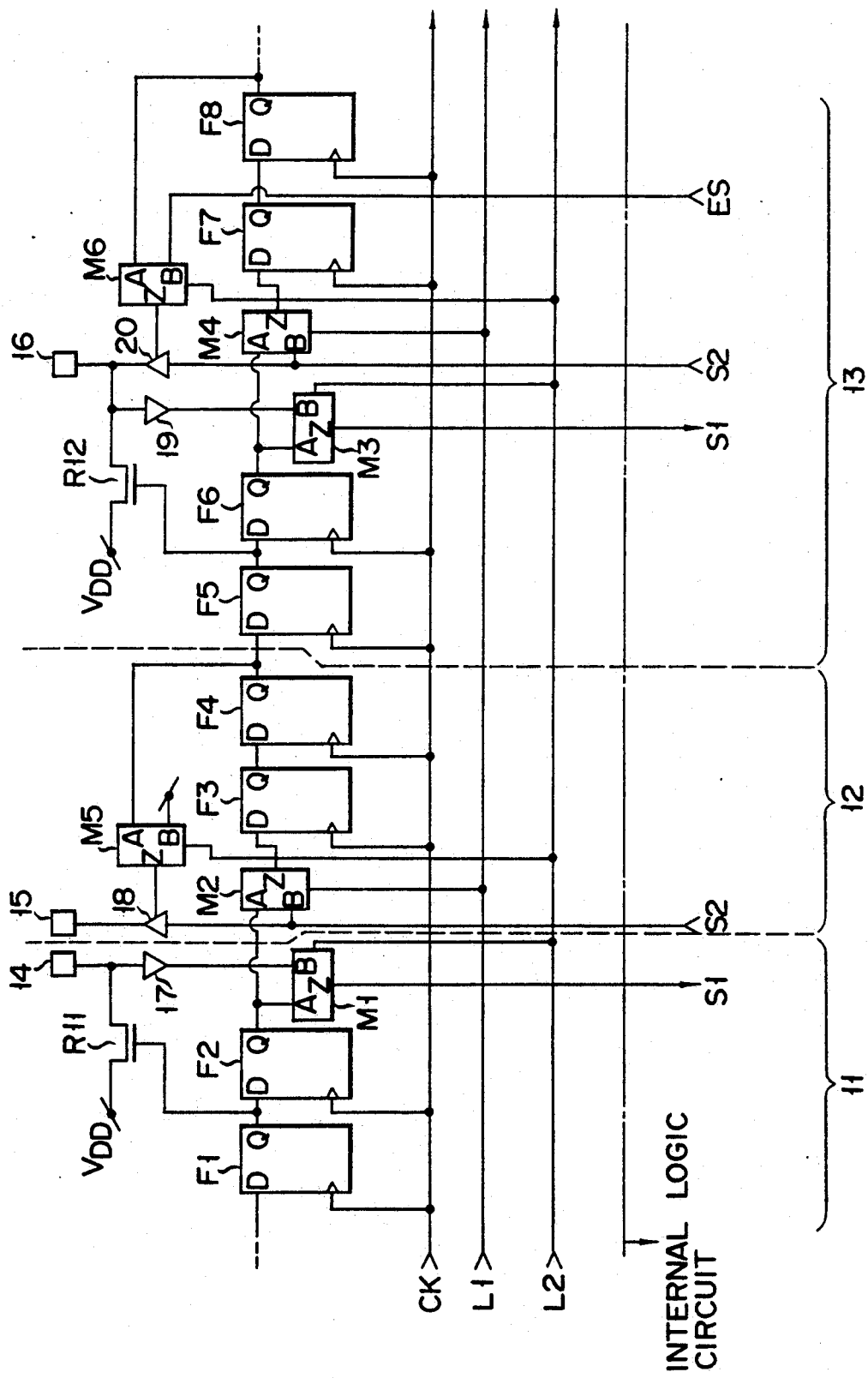
F I G. 1

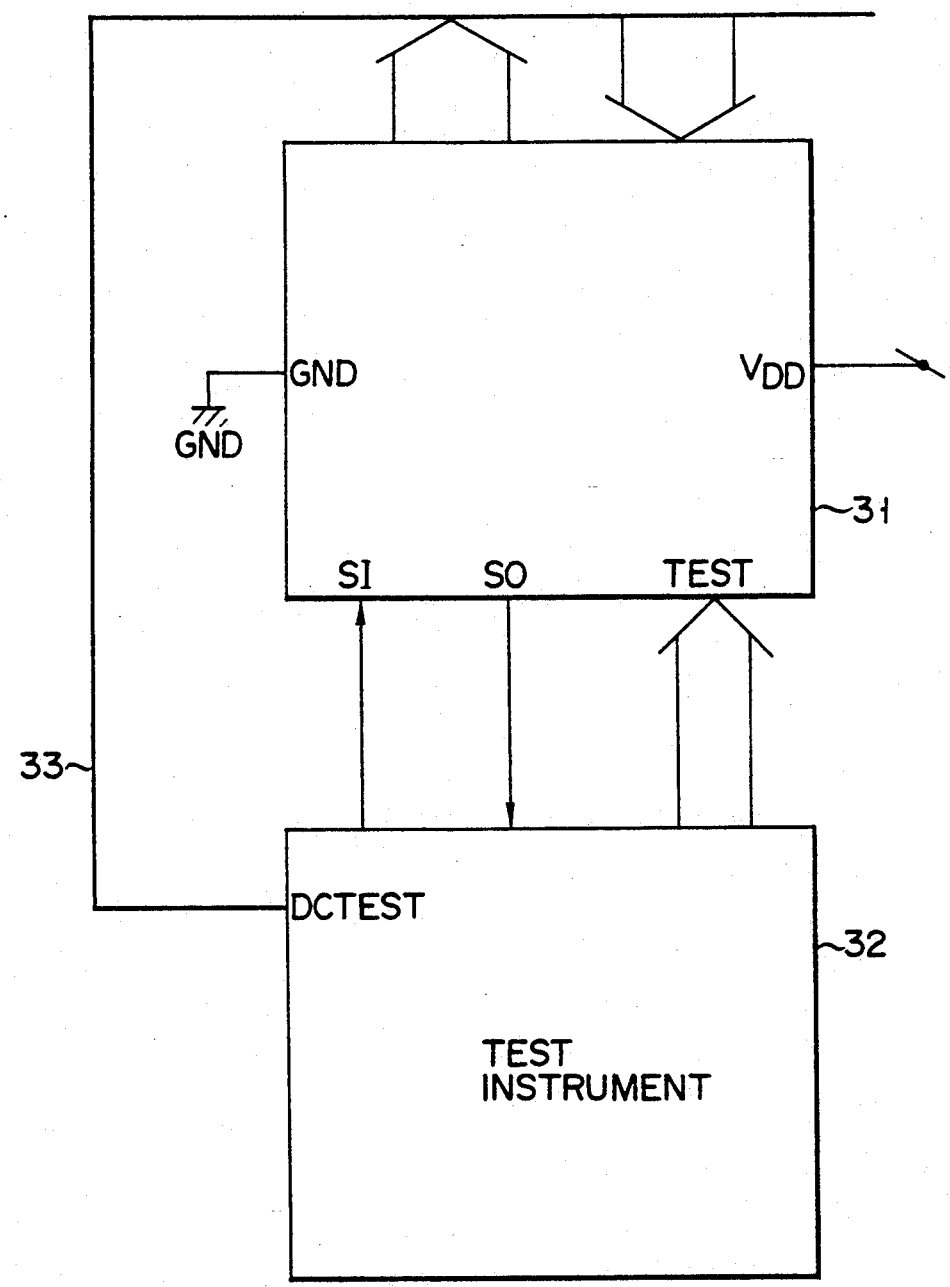
F I G. 2

TESTING INTEGRATED CIRCUIT CAPABLE OF EASILY PERFORMING PARAMETRIC TEST ON HIGH PIN COUNT SEMICONDUCTOR DEVICE

BACKGROUND OF THE INVENTION

1. Field of the Invention

This invention relates generally to a testing integrated circuit for testing a logical integrated circuit, and more particularly to a testing integrated circuit which can easily perform parametric test by means of a simple custom-designed test apparatus.

2. Description of the Related Art

As disclosed in U.S. Pat. No. 4,749,947, a testing integrated circuit for testing functions of an IC chip has been developed in various fashions, and the size of a test structure has been increased as functions of an IC chip become more complicated.

A test structure and method called boundary-scan are known, by which a large scale digital system including a plurality of IC chips having number of input and output pins can be tested easily. A basic concept of the boundary-scan-testing is disclosed in U.S. Pat. No. 3,790,885. Nowadays a digital microcircuit device has a great number of signal lines, which increases the cost of a system to test it. The boundary-scan testing is an effective technique to overcome this problem.

A boundary-scan-testing device has the following structure, for example. A peripheral cell area of an IC chip includes memory circuits for use in test, each connected to a signal line connected to an external terminal. The memory circuits are connected each other to constitute a shift register serving as a testing structure. With such IC chips mounted on a board, a functional test is performed by utilizing the testing structure. Each of the IC chips has a data input terminal, a data output terminal, and a test control terminal. The terminals of the IC chips are connected so as to perform a desired test. Data for use in a test is serially input through the data input terminal of an IC chip, subjected to a serial shift operation by a control signal, and serially output through the data output terminal. In this manner, data can be written in and read out from memory circuits. In other words, the serial shift operation of the test data allows an individual test for each of the IC chips.

The boundary-scan-testing is advantageous not only in the functional test performed independently for each of the IC chips on the board, but also in an inspection of preparation for delivery of semiconductor devices including IC chips. More specifically, a boundary-scanning structure such as memory circuits arranged to form a shift register incorporated in an IC chip is utilized to inspect a semiconductor device. The inspection is effective particularly in testing a logic device having a plurality of pins, which requires data to be input through a number of input terminals thereof. Since, in boundary-scan testing, a test data can be supplied to an IC chip by a serial test data operation, a functional test can be performed by a custom-designed test apparatus having a small number of pins. These test technique contribute to unacceptable increase of high pin count device's testing cost.

However, the conventional structure for boundary-scan-testing cannot perform a parametric test on peripheral cells in an IC chip. A parametric test is an indispensable item in an inspection of preparation for delivery. In the parametric test, electric characteristics (e.g., input and output current characteristics) of peripheral cells such as input and output buffers, provided on the periphery of a logic device, are tested.

In the conventional boundary-scan-testing structure, only the data input terminal, the data output terminal, and the test terminal for supplying a control signal are connected to a custom-made test apparatus. Hence, a parametric test cannot be performed for every input and output buffers provided on the periphery of the logic device.

As described above, in an IC chip having a structure for boundary-scan-testing according to the conventional art, although a functional test can be performed by a serial operation, a parametric test cannot be performed for the peripheral cells such as every input and output buffers without boundary-scan test terminals provided in the peripheral area of the IC chip.

SUMMARY OF THE INVENTION

Accordingly, an object of the invention is to provide a testing integrated circuit capable of performing a parametric test with a small number of test pins by means of a structure for performing boundary-scan-testing.

The object is achieved by a boundary-scan-testing integrated circuit adapted to both a functional test on an entire IC chip and a parametric test, comprising:

first memory circuits respectively formed in an input buffer portion, an output buffer portion, and a bidirectional buffer portion, which are provided in a peripheral cell area of the IC chip and respectively connected to an input pad, an output pad, and a bidirectional pad;

second memory circuits, formed in the peripheral cell area of the IC chip, for controlling ON/OFF operations of active elements, formed in the input buffer portion and the bidirectional buffer portion, for supplying a pad potential;

third memory circuits, formed in the peripheral cell area of the IC chip, for controlling ON/OFF operations of tristate buffers of the output buffer portion and the bidirectional buffer portion;

circuit means functioning as a shift register controlled by a first control signal, said circuit means being constituted by said first, second, and third memory circuits serially connected;

first data selectors for receiving data output from the first memory circuits and a signal output from the input buffer, selecting one of them in accordance with a second control signal, and supplying it to an internal logic circuit of the IC chip; and second data selectors for receiving data output from the third memory circuits and a normal operation signal, selecting one of them in accordance with a third control signal, and supplying it as an operation control signal to the output buffer portion.

With the above structure, the first and second memory circuits constitute a circuit structure for performing a parametric test by means of a data shift operation in boundary-scan testing. As a result, a parametric test on input and output buffers and the like can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a circuit diagram showing an embodiment of the present invention;

FIG. 2 is a circuit diagram showing a structure, in which the present invention is applied, for performing parametric testing and boundary-scan-testing.

DETAILED DESCRIPTION OF THE PREFERRED EMBODIMENTS

Figure 3:
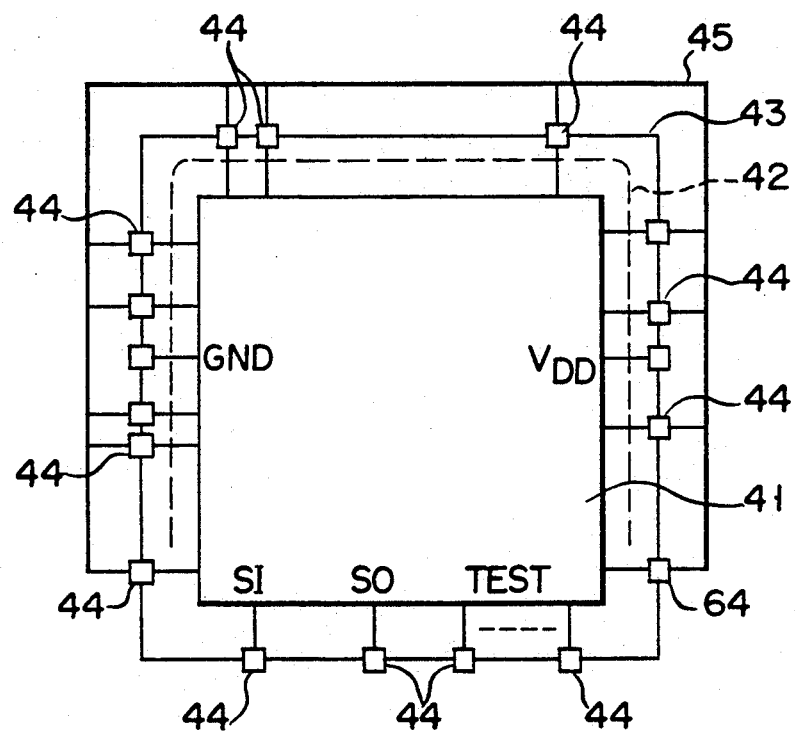
FIG. 3 is a circuit diagram showing an application of the present invention.

FIG. 1 is a circuit diagram showing a peripheral cell area in an IC chip of a logic device adapted to boundary-scan according to the present invention. The peripheral cell area includes an input buffer portion 11, an output buffer portion 12, and bidirectional buffer portion 13. These buffers comprise memory circuits, i.e., D-type flip-flops F1 to F8 which are connected serially, constituting a shift register.

The flip-flops F1 and F respectively control the resistance values of a pull-up or pull-down resistor connected between an input pad 14 and a power source $V_{DD}$, and a pull-up or pull-down resistor connected between a bidirectional pad 16 and the power source $V_{DD}$. In this embodiment, pull-up resistors R11 and R12 are constituted by MOS FETs, whose gates are respectively connected to output terminals Q of the flip-flops F1 and F5.

The flip-flops F1 to F8 are shift-controlled by a clock signal CK. Predetermined bidirectional signals are associated with two-input data multiplexers M1 to M6, as follows. The multiplexers M1 and M3 control paths of signals input through the pads 14 and 16 by a test mode control signal L2. The multiplexers M5 and M6 control paths of signals which are to be output through an output pad 15 and the bidirectional pad 16 from an internal logic circuit by a test mode control signal L1. The multiplexers M5 and M6 respectively control tristate buffers 18 and 20, which are connected to the output pad 15 and the bidirectional pad 16, respectively.

In the multiplexer M1 in the input buffer portion 11, a terminal A receives an output Q from the flip-flop F2, and a terminal B receives a signal from an input buffer 17. The multiplexer M1 outputs a signal S1, which has been input throuqh either the terminal A or B, to the internal logic circuit through a terminal Z in response to the test mode control signal L2.

In the multiplexer M2 in the output buffer portion 12, a terminal A receives an output Q from the flip-flop F2, and a terminal B receives an output S2 from the internal logic circuit. The multiplexer M2 outputs a signal, which has been input through either the terminal A or B, is supplied to the flip-flop F3 through a terminal Z in response to the test mode control signal L1.

In the multiplexer M3 in the bidirectional buffer portion 13, a terminal A receives an output Q from the flip-flop F6, and a terminal B receives a signal from an input buffer 19. The multiplexer M3 outputs a signal S1, which has been input through either the terminal A or B, to the internal logic circuit through a terminal Z in response to the test mode control signal L2.

In the multiplexer M4 in the bidirectional buffer portion 13, a terminal A receives an output Q from the flip-flop F6, and a terminal B receives a signal S2 from the internal logic circuit. The multiplexer M1 outputs a signal, which has been input through either the terminal A or B, to the flip flop F7 through a terminal Z in response to the test mode control signal L1.

The flip-flops F4 and F8 and the two-input data multiplexers M5 and M6 are arranged so as to control ON/OFF operations of the tristate buffers 18 and 20, which are respectively connected to the output pad 15 and the bidirectional pad 16.

In the multiplexer M5 in the output buffer portion 12, a terminal A receives an output Q from the flip-flop F4, and a terminal B receives a signal voltage for a normal operation. The multiplexer M1 outputs a signal, which has been input through either the terminal A or B, to the tristate buffer 18 through a terminal Z in response to the test mode control signal L2.

In the multiplexer M6 in the bidirectional buffer portion 13, a terminal A receives an output Q from the flip-flop F8, and a terminal B receives an enable signal ES for a normal operation from the internal logic circuit. The multiplexer M6 outputs a signal, which has been input through either the terminal A or B, to the tristate buffer 20 through a terminal Z in response to the test mode control signal L2.

An operation of the circuit for performing boundary-scanning will now be described.

The flip-flops F1 to F8 shift input data in response to a clock signal CK. In an normal operation mode, the two-input data multiplexers M1 to M6 select inputs through their terminals B. As a result, the circuit for performing the boundary-scanning is not available in normal mode. In other words, a circuit system is formed by connecting the input pad 14, the output pad 15, and the bidirectional pad 16 through the buffers 17 to 20 to the internal logic circuit.

In a boundary-scan mode, the two-input data multiplexers M1 to M6 select inputs through their terminals A. In the input buffer portion 11, at this time, the value of signal S1 is determined by the flip-flop F1 and also transmitted to the internal logic circuit. In the output buffer portion 12, the signal S1 output from the internal logic circuit can be fetched in the flip-flop F3. The data fetched in the multiplexer M2 is shifted by a serial operation, and output to an external device so that the user can observe it. The bidirectional buffer portion 13 performs a function cf the input and output buffer portions 11 and 12.

An ON/OFF operation of the input/output pad 16 connected to the tristate buffer 20 is controlled by an enable control signal ES in a normal operation mode, and by an output Q from the flip-flop F8 in a boundary-scan-testing mode.

In the above-described structure, with all of the external terminals of the input and output buffers directly connected, the output current characteristic of a specific output buffer can be detected in a parametric test, not being influenced by the pull up or pull-down resistor (R11, R12) connected to the input buffers. More specifically, to detect the characteristic of an output buffer, boundary-scanning data is set in the flip-flops F1 to F8, serving as memory circuits, such that only the specific output or tristate buffer is switched on, and the pull-up or pull-down resistor is switched off. Similarly, to detect the characteristic of an input buffer in a parametric test, boundary-scanning data is set in the flip-flops F1 to F8, such that only the pull-up or pull-down resistor connected to a specific input buffer to be tested is switched on, and all the output or tristate buffers are switched off. In this manner, the characteristics of the buffers can be inspected independently. If an IC chip includes neither a pull-up resistor nor a pull-down resistor, the impedance of the IC chip is normally extremely high, and it is unnecessary to test the characteristics of the input buffers independently.

FIG. 2 shows a structure for testing an IC chip 31 which is arranged as shown in FIG. 1 by means of a custom-designed testing instrument 32

The IC chip 31 can be accessed by the testing instrument 32 through a test terminal provided in the IC chip 31: for example, serial data SI and serial data SO are input to and output from the IC chip 31, respectively, and a control signal TEST relating to a test mode is supplied to the IC chip 31. It can be accessed by the testing instrument 32 also via terminals other than the exclusive test terminal through a signal line 33 in which a control signal DCTEST for a parametric test is transmitted. With this structure, general signal lines for transmitting signals are directly connected to the signal line 33 except the serial input signal SI, the serial output signal SO, and the test control signal DCTEST.

As a result, both boundary-scan-testing and parametric testing can be performed with maintaining the advantage of the boundary-scan method that an IC chip to be inspected and the custom-designed test apparatus can be connected with a small number of connection pins.

As described above, since only one additional test line suffices to perform a parametric test, a final test of inspection of preparation for delivery of semiconductor devices can be achieved by a simple test apparatus.

Moreover, IC chips patterned on a wafer, which are not dice, can be tested by a so-called prove card having a small number of and a few types of test terminals. For this purpose, signal lines for performing a parametric test for the wafer must be directly connected one another. FIG. 3 shows an IC chip in the wafer, which includes a boundary-scan-testing structure. The IC chip 43 comprises an internal logic circuit 41 and a chip peripheral cell area 42 including input and output buffers and the like. Memory circuits (e.g., flip-flops) 44 for use in boundary-scan-testing are formed so as to respectively correspond to the input/output pads of the IC chip 43, and serially connected. A signal line 45 for parametric test is connected to each peripheral signals together. In this manner, the portions which should be subjected to parametric test are connected to the signal line 45 via the memory circuits 44.

If a test is performed in the above-mentioned state, in order to prevent transient contention of output signals from output buffers connected to the signal line 45 during a data serial shifting operation, the testing apparatus must fulfill function for compulsorily turning off an output buffer. The function can be easily achieved by providing two enable control lines to an output or tristate buffer.

The chip as described above can be inspected by a prove card having a small number of pins corresponding to the terminals for serial input and output signals SI and SO, and the terminal for test control signals TEST including a signal for a parametric test.

As has been described above, the testing circuit of the present invention comprises, in a memory circuit for boundary-scan-testing, a control circuit for a parametric test utilizing a data shift operation in boundary-scanning. Therefore, a simple test circuit which can easily perform a parametric test can be provided in a logic device adapted to boundary-scanning.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A boundary-scan-testing integrated circuit adapted to both a functional test on an entire IC chip and a parametric test, comprising:
   first memory circuits respectively formed in an input buffer portion, an output buffer portion, and an bidirectional buffer portion, which are provided in a peripheral cell area of the IC chip and respectively connected to an input pad, an output pad, and an bidirectional pad;
   second memory circuits, formed in the peripheral cell area of the IC chip, for controlling ON/OFF operations of active elements, formed in the input buffer portion and the bidirectional buffer portion, for supplying a pad potential;
   third memory circuits, formed in the peripheral cell area of the IC chip, for controlling ON/OFF operations of tristate buffers of the output buffer portion and the bidirectional buffer portion;
   circuit means functioning as a shift register controlled by a first control signal, said circuit means being constituted by said first, second, and third memory circuits serially connected;
   first data selectors for receiving data output from the first memory circuits and a signal output from the input buffer, selecting one of them in accordance with a second control signal, and supplying it to an internal logic circuit of the IC chip; and
   second data selectors for receiving data output from the third memory circuits and a normal operation signal, selecting one of them in accordance with a third control signal, and supplying it as an operation control signal to the output buffer portion.

2. A boundary-scan-testing integrated circuit according to claim 1, wherein said first, second, and third memory circuits are flip-flops of the same type.

3. A boundary-scan-testing integrated circuit according to claim 1, wherein said active elements are constituted by MOS FETs, and data output from said second memory devices is applied to the gates of the MOS FETs.

4. A boundary-scan-testing integrated circuit according to claim 3, wherein said MOS FETs function as pull-up resistors.

5. A boundary-scan-testing integrated circuit according to claim 3, wherein said MOS FETs function as pull-down resistors.

6. A boundary-scan-testing integrated circuit according to claim 1, wherein said first and second data selectors are each constituted by a two-input multiplexer.

7. A boundary-scan-testing integrated circuit according to claim 1, wherein the normal operation signal received by said second data selectors has a constant potential for enabling an operation of the output buffer which receives the operation control signal from said second data selectors, if the output buffer is connected to the output pad.

8. A boundary-scan-testing integrated circuit according to claim 1, wherein the normal operation signal received by said second data selectors is an enable control signal supplied from the integral logic circuit and enabling ON/OFF operations of the output buffer, if the output buffer is connected to the bidirectional pad.

9. A boundary-scan-testing integrated circuit according to claim 1, further comprising common connection means for directly connecting the pads which should be subjected to a parametric test on the IC chip.

10. A boundary-scan-testing integrated circuit according to claim 9, wherein said common connection means is formed on an IC chip pattern on a wafer from which IC chips are not to be dice.

11. A boundary-scan-testing integrated circuit adapted to both a functional test on an entire IC chip and a parametric test on each of input buffers and output buffers provided in a peripheral cell area connected to pads of the IC chip, comprising:
- first memory devices respectively provided for a signal input line connected to the input buffer and a signal output line connected to the output buffer in the peripheral cell area of the IC chip;
- active elements, provided in the peripheral cell area of the IC chip, for applying a potential to a connection node of the input buffer and a pad;
- second memory circuits for controlling ON/OFF operation of the active elements;
- third memory circuits, provided in the peripheral cell area of the IC chip, for controlling ON/OFF operations of the signal output line;
- circuit means functioning as a shift register controlled by a first control signal, said circuit means being constituted by said first, second, and third memory circuits serially connected;
- first data selectors for receiving data output from the first memory circuits and a signal output from the signal input line, selecting one of them in accordance with a second control signal, and supplying it to an internal logic circuit of the IC chip; and
second data selectors for receiving data output from the third memory circuits and a normal operation signal, selecting one of them in accordance with a third control signal, and supplying it as an operation control signal to the output buffer portion.

12. A boundary-scan-testing integrated circuit according to claim 11, wherein said first, second, and third memory circuits are flip-flops of the same type.

13. A boundary-scan-testing integrated circuit according to claim 11, wherein said active elements are constituted by MOS FETs, and data output from said second memory circuits is applied to the gates of the MOS FETs.

14. A boundary-scan-testing integrated circuit according to claim 13, wherein said MOS FETs function as pull-up resistors.

15. A boundary-scan-testing integrated circuit according to claim 13, wherein said MOS FETs function as pull-down resistors.

16. A boundary-scan-testing integrated circuit according to claim 11, wherein said first and second data selectors are each constituted by a two-input multiplexer.

17. A boundary-scan-testing integrated circuit according to claim 11, wherein the normal operation signal received by said second data selectors has a constant potential for enabling an operation of the output buffer which receives the operation control signal from said second data selectors, if the pad is an output pad.

18. A boundary-scan-testing integrated circuit according to claim 11, wherein the normal operation signal received by said second data selectors is an enable control signal supplied from the integral logic circuit and enabling ON/OFF operations of the output buffer, if the pad is an bidirectional pad.

19. A boundary-scan-testing integrated circuit according to claim 11, further comprising common connection means for directly connecting the pads which should be subjected to a parametric test on the IC chip.

20. A boundary-scan-testing integrated circuit according to claim 19, wherein said common connection means is formed on an IC chip pattern on a wafer from which IC chips are to be cut off.

* * * * *

UNITED STATES PATENT AND TRADEMARK OFFICE
CERTIFICATE OF CORRECTION

PATENT NO. : 5,115,191
DATED : May 19, 1992
INVENTOR(S) : Takashi Yoshimori

It is certified that error appears in the above-identified patent and that said Letters Patent is hereby corrected as shown below:

Claim 1, column 6, line 19, after, "and" change "an" to --a--.

Claim 1, column 6, line 23, after "and" change "an" to --a--.

Claim 18, column 8, line 35, change "an" to --a--.

Signed and Sealed this

Ninth Day of November, 1993

Attest:

BRUCE LEHMAN

Attesting Officer

Commissioner of Patents and Trademarks